(12) United States Patent
Pomeranz et al.

(10) Patent No.: US 8,995,494 B1
(45) Date of Patent: Mar. 31, 2015

(54) MULTI-BAND LASER ARCHITECTURE

(75) Inventors: Leonard A Pomeranz, Hollis, NH (US);
Joseph M Owen, Derry, NH (US);
Michael J. Shaw, Concord, NH (US);
David P. Kelly, Nashua, NH (US);
Philip R. Staver, Wilton, NH (US);
Peter A. Budni, Nashua, NH (US); John C. Wikman, Lyndeborough, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 340 days.

(21) Appl. No.: 13/441,435

(22) Filed: Apr. 6, 2012

Related U.S. Application Data

(60) Provisional application No. 61/481,097, filed on Apr. 29, 2011.

(51) Int. Cl.
*H01S 3/09* (2006.01)
*G02F 1/35* (2006.01)
*G02F 1/355* (2006.01)
*G02F 1/39* (2006.01)
*H01S 5/00* (2006.01)
*H01S 5/06* (2006.01)

(52) U.S. Cl.
CPC .............. *H01S 5/0092* (2013.01); *G02F 1/353* (2013.01); *G02F 1/355* (2013.01); *G02F 1/395* (2013.01); *H01S 5/0615* (2013.01)
USPC ................... 372/69; 372/21; 372/22; 372/64; 372/70

(58) Field of Classification Search
CPC .................... H01S 3/0092; H01S 3/09–3/091; H01S 3/093; H01S 3/094053; H01S 3/108–3/109; H01S 3/1095
USPC .............................. 372/23, 69, 70, 21–2, 702
See application file for complete search history.

(56) References Cited

U.S. PATENT DOCUMENTS

| | | | |
|---|---|---|---|
| 2001/0033595 A1* | 10/2001 | Miyake | 372/66 |
| 2003/0021325 A1* | 1/2003 | Masterson et al. | 372/92 |
| 2005/0018630 A1 | 1/2005 | Bianchi et al. | |
| 2009/0207483 A1* | 8/2009 | Goto | 359/341.1 |
| 2013/0035676 A1* | 2/2013 | Mitchell et al. | 606/10 |

\* cited by examiner

*Primary Examiner* — Dung Nguyen
(74) *Attorney, Agent, or Firm* — Finch & Maloney PLLC; Neil F. Maloney

(57) ABSTRACT

Techniques and architecture are disclosed for providing a laser system. In one specific example embodiment, the system includes a thulium-doped fiber laser coupled by silica glass fiber to a remote optical converter (ROC) including a Ho:YAG laser and, optionally, an optical parametric oscillator (OPO) utilizing zinc germanium phosphide ($ZnGeP_2$; ZGP) or orientation-patterned gallium arsenide (OPGaAs). The fiber laser may emit a low-peak-power, continuous wave pump signal that pumps the Ho:YAG laser, which in turn emits a higher-peak-power, pulsed signal. When included, the OPO can be used to convert the resultant, pulsed signal to a longer wavelength (e.g., about 2-5 μm, or greater). In some cases, distributed architecture and reduced weight/bulk may be realized while eliminating the need to actively cool the ROC for operation, for example, over a broad temperature range (e.g., −55-125° C.). Also, methods of preparing high-peak-power, pulsed signals using such systems are disclosed.

18 Claims, 3 Drawing Sheets

MULTI-BAND LASER ARCHITECTURE

CROSS-REFERENCE TO RELATED APPLICATIONS

This application claims benefit of U.S. Provisional Patent Application Ser. No. 61/481,097, filed on Apr. 29, 2011. Each patent and patent application cited herein is hereby incorporated by reference in its entirety.

STATEMENT OF GOVERNMENT INTEREST

The invention was made with United States Government support under contract N00173-05-C-6020 awarded by the Department of the Navy. The United States Government has certain rights in this invention.

FIELD OF THE DISCLOSURE

The invention relates to laser systems, and more particularly to distributed architecture laser systems.

BACKGROUND

Laser system design involves a number of non-trivial challenges, and systems incorporating distributed architecture components have faced particular complications, such as those with respect to achieving reduced weight, bulk, power consumption, and cost while optimizing device performance. Continued device scaling will tend to exacerbate such problems.

SUMMARY

One example embodiment of the present invention provides a device including a first laser configured to emit a first signal, a remote optical converter comprising a second laser, wherein the remote optical converter is configured to convert the first signal to a second signal of different peak power and/or different wavelength than the first signal, and an optical fiber operatively coupling the first laser and the remote optical converter, wherein the optical fiber is configured to transport the first signal from the first laser to the second laser. In some cases, the remote optical converter further includes a non-linear converter operatively coupled to the second laser. In some such cases, the first signal comprises a continuous wave signal having a wavelength less than 2 µm and a peak power less than about 200 W, and the non-linear converter comprises an optical parametric oscillator configured to convert the second signal to a third signal of higher peak power and having a wavelength in the range of 2-5 µm or greater. In some further such cases, the first signal comprises a continuous wave signal having a wavelength less than 2 µm and a peak power less than about 200 W, and wherein the non-linear converter comprises a harmonic generator configured to convert the second signal to a third signal of lower peak power and having a wavelength in the range of about 0.7-1.9 µm. In some further such cases, the non-linear converter comprises cadmium selenide, silver gallium sulfide, silver gallium selenide, gallium(II) selenide, rubidium titanyl arsenate, potassium titanyl arsenate, potassium titanyl phosphate, lithium niobate, periodically-poled lithium niobate, periodically-poled lithium tantalate, or periodically-poled potassium titanyl phosphate, orientation-patterned gallium arsenide, orientation-patterned gallium phosphide, or zinc germanium phosphide. In some cases, the first laser comprises thulium (Tm)-doped fiber, gallium arsenide (GaAs), indium phosphide (InP), Tm-doped yttrium lithium fluoride (Tm:YLF), Tm-doped yttrium aluminum perovskite (Tm:YAP), or Tm-doped yttrium aluminum garnet (Tm:YAG). In some cases, the second laser is Q-switched via an operatively coupled acousto-optic Q-switch, electro-optic Q-switch, or passive Q-switch using a saturable absorbing medium. In some cases, the second laser comprises a neodymium-, holmium-, erbium-, thulium-, or ytterbium-doped crystal. In some cases, the second laser comprises holmium (Ho)-doped yttrium aluminum garnet (Ho:YAG), Ho-doped yttrium lithium fluoride (Ho:YLF), Ho-doped yttrium aluminum perovskite (Ho:YAP), or Ho-doped yttrium vanadate (Ho:YVO$_4$). In some cases, the optical fiber comprises silica glass fiber, phosphate glass fiber, or germanate glass fiber. In some cases, the first laser comprises a fiber laser and the optical fiber is fusion spliced to an output thereof. In some cases, the optical fiber further comprises a lens assembly for operatively coupling the first laser and the remote optical converter. In some cases, the device is configured to operate in the temperature range of about −55-125° C. in the absence of active cooling.

Another example embodiment of the present invention provides a method including the steps of producing a first signal with a first laser, wherein the first signal has a wavelength of less than 2 µm and a peak power less than about 200 W, transporting the first signal over an optical fiber operatively coupling the first laser to a remote optical converter comprising a second laser, and converting the first signal with the remote optical converter into a second signal, wherein the second signal has a higher peak power and/or a different wavelength than the first signal. In some cases, the method further includes the step of conditioning the second signal. In some cases, the first laser comprises thulium (Tm)-doped fiber, gallium arsenide (GaAs), indium phosphide (InP), Tm-doped yttrium lithium fluoride (Tm:YLF), Tm-doped yttrium aluminum perovskite (Tm:YAP), or Tm-doped yttrium aluminum garnet (Tm:YAG). In some cases, the remote optical converter further comprises a non-linear converter operatively coupled to the second laser, and wherein the non-linear converter comprises an optical parametric oscillator or a harmonic generator. In some cases, the optical fiber comprises silica glass fiber, phosphate glass fiber, or germanate glass fiber.

Yet another example embodiment of the present invention provides a system including a thulium-doped fiber laser, a remote optical converter including Q-switched holmium-doped yttrium aluminum garnet (Ho:YAG) and an optical parametric oscillator comprising zinc germanium phosphide (ZnGeP$_2$) or orientation-patterned gallium arsenide (OP-GaAs), and a silica glass optical fiber operatively coupling the fiber laser and the remote optical converter, wherein the system is configured to operate in the temperature range of about −55-125° C. in the absence of active cooling. In some cases, the fiber laser is configured to emit a continuous wave signal having a wavelength less than 2 µm and a peak power less than about 200 W, and the remote optical converter is configured to convert the signal to a second signal of higher peak power and/or different wavelength.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

Figure 1:
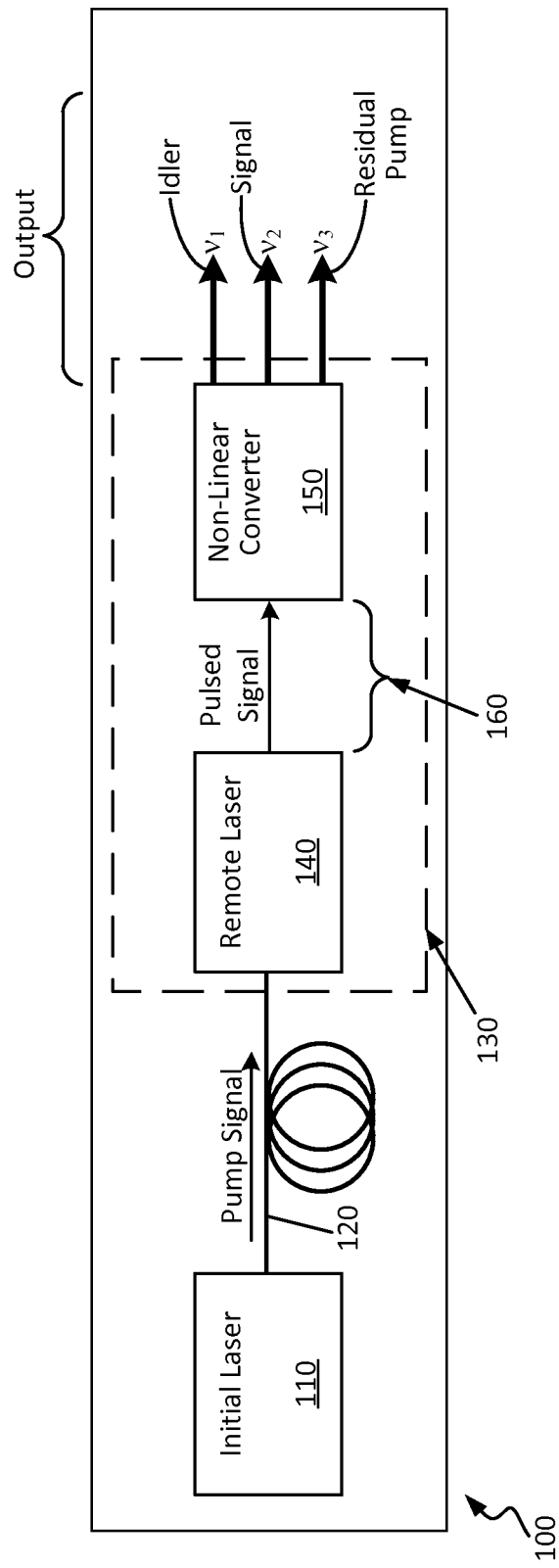
FIG. 1 illustrates a block diagram view of a laser system configured in accordance with an embodiment of the present invention.

These and other features of the present embodiments will be understood better by reading the following detailed description, taken together with the figures herein described. The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Techniques and architecture are disclosed for providing a laser system. In one specific example embodiment, the system includes a thulium-doped fiber laser coupled by silica glass fiber to a remote optical converter (ROC) including a Ho:YAG laser and, optionally, an optical parametric oscillator (OPO) utilizing zinc germanium phosphide ($ZnGeP_2$; ZGP) or orientation-patterned gallium arsenide (OPGaAs). The fiber laser may emit a low-peak-power, continuous wave pump signal that pumps the Ho:YAG laser, which in turn emits a higher-peak-power, pulsed signal. When included, the OPO can be used to convert the resultant, pulsed signal to a longer wavelength (e.g., about 2-5 µm, or greater). In some cases, distributed architecture and reduced weight/bulk may be realized while eliminating the need to actively cool the ROC for operation, for example, over a broad temperature range (e.g., −55-125° C.). Also, methods of preparing high-peak-power, pulsed signals using such systems are disclosed. Numerous configurations and variations will be apparent in light of this disclosure.

GENERAL OVERVIEW

As will be appreciated, in some laser-based applications it may be desirable to separate the laser source from the delivery mechanism. For example, in some cases the laser source size, weight, and/or power dissipation properties may make it unfeasible for placement near the location where the optical beam is to be applied in a given application (e.g., a laser beam director on the skin of an aircraft or on the end of a robotic arm). Waveguides made from optical glass fibers offer a means by which to remotely locate the laser source. However, present-day optical fibers are limited for applications in which the laser source either: (1) has high-peak-power pulses; or (2) emits light in an extended wavelength range greater than 2 µm. As such, there are a number of non-trivial problems associated with conventional designs/techniques of coupling high-peak-power lasers and/or lasers with extended spectral range beyond 2 µm from a centralized source to remote locations/pointers/heads.

One example approach for wavelengths beyond 2 µm involves using chalcogenide or fluoride optical glass fibers to transmit light from a centralized high-peak-power, broad-wavelength laser source (e.g., emitting in the middle infrared within the 2-5 µm wavelength range) to a remote location/pointer/head. However, use of such fibers can result in transmission losses and bend losses and can require specialized end surface preparation, all of which limit the practical fiber length for installation in a given platform. Furthermore, use of such fibers limits the wavelength range, brightness, and peak power handling capability of the transmitted beam (e.g., that exits the remote heads).

Another example approach involves using fused silica (e.g., amorphous silicon dioxide)-based glass fiber, which offers low transmission loss and low bend losses, but is limited to wavelengths below 2 µm. Silica-based fibers are easier to prepare, and there are many existing tools that can cleave, polish, and splice fiber ends for low losses and high-reliability cables. However, silica-based fibers have not been acceptable substitutes for chalcogenide/fluoride glass fibers in these applications because, although silica-based fibers are useful to transport light of wavelengths up to 2 µm, silica-based fiber losses become large at higher wavelengths. Also, as with any small core fiber, silica-based fiber exhibits difficulty in handling high peak power, which causes non-linear response and damage to occur thereto. Larger core sizes can be designed, but this in turn imposes limitations on fiber bend radius and limits the brightness of the laser beam transmitted through the fiber. Consequently, conventional implementation of silica-based fibers typically results in bulky/heavy systems that suffer from high cost and poor reliability, particularly in a distributed aperture application, due to the inability to remotely route laser power through long silica glass fibers.

Thus, and in accordance with an embodiment of the present invention, techniques are disclosed for implementing a laser system in which an initial pump signal (e.g., a low-peak-power, continuous wave signal of less than 2 µm) produced by an initial pump laser is transported over a silica-based fiber to one or more remotely located optical converters (remote optical converter or ROC) configured to convert the initial pump signal to a longer wavelength signal (e.g., 2-5 µm or greater).

In some embodiments, the initial pump laser may be configured to generate/emit a signal having a wavelength of less than 2 µm. In accordance with an embodiment, this pump signal may have a sufficiently low peak power so as to avoid damaging the silica-based fiber over which it is transported to the ROC. The pump signal may be of a sufficiently high peak power to pump the ROC, which may include a laser configured to provide a higher-peak-power, pulsed laser signal and/or an optionally included non-linear converter. In some embodiments, the initial pump laser may be configured with componentry/electronics for providing electrical signaling and/or powering of the ROC. In accordance with an embodiment, the initial pump laser may be remotely located, separated, or otherwise discrete from the ROC.

In some embodiments, the silica-based fiber is configured to transport an initial pump signal having a wavelength of less than 2 µm from the initial pump laser to a ROC without hampering/interfering with the ability of the pump signal to sufficiently pump the ROC (e.g., a higher-peak-power, pulsed laser signal source and/or an optionally included non-linear converter).

In some embodiments, one or more ROCs are configured to convert the initial pump signal (e.g., a low-peak-power, continuous wave signal of less than 2 µm) to a higher-peak-power, longer-wavelength (e.g., in the range of about 2-20 µm, or greater) signal and to emit that signal at a location that is remotely located, separated, or otherwise discrete from the initial pump signal source. In other cases, a ROC may be configured to convert the initial pump signal to a lower-peak-power wavelength signal (e.g., less than or equal to about 1.9 µm) and emit that signal in similar fashion. In some cases, a ROC configured in accordance with an embodiment of the present invention may implement, for example, a high-peak-power, pulsed laser and/or an optionally included non-linear converter. In some such cases, the high-peak-power, pulsed laser may be configured to receive the initial low-peak-power, continuous wave pump signal and output a higher-peak-power, pulsed signal of comparatively longer wavelength. In some cases, an optionally included non-linear converter may be configured to receive the high-peak-power, pulsed laser signal and output a signal of comparatively longer wavelength.

In accordance with an embodiment, the higher-peak-power, longer-wavelength signal generated by a ROC may be conditioned prior to exiting the ROC (or otherwise downstream from the ROC) to suit the demands of a given application. For example, in some embodiments, the laser system may include or otherwise utilize additional optics (e.g., lenses and/or mirrors) configured to alter one or more characteristics of the signal, such as, but not limited to, beam width, focus, etc. Other suitable conditioning configurations/methodologies will be apparent in light of this disclosure.

As previously noted, some embodiments of the present invention may be implemented to generate/emit a signal having a wavelength in the range of 2-5 µm by converting an initial pump signal of less than 2 µm. However, the claimed invention is not so limited. For example, and in accordance with an embodiment, techniques disclosed herein may be implemented to generate/emit a signal having a wavelength that is longer than 5 µm. Furthermore, techniques disclosed herein may be implemented to generate/emit multiple wavelengths and/or pulsed, high-peak-power signals that otherwise could not be transported readily/easily over optical fiber couplings (e.g., silica-based fiber). Other uses/implementations will depend on a given application and will be apparent in light of this disclosure.

In accordance with an embodiment of the present invention, techniques described herein may be implemented, for example, in a distributed architecture laser system to generate/emit a signal having a wavelength in the range of 2-5 µm or greater while minimizing/eliminating limitations and detrimental effects associated with conventional techniques/designs, such as, but not limited to, peak power handling limitations typically associated with optical glass fiber (e.g., by non-linear processes and/or optical damage). Therefore, in accordance with an embodiment of the present invention, implementation of techniques described herein may provide for lower-peak-power transport of a signal over optical glass fiber (e.g., silica-based fiber) and thus minimize/eliminate the peak-power limitations typically associated with optical glass fibers that impede conventional designs/methodologies.

Devices configured in accordance with an embodiment of the present invention may comprise components including, but not limited to: one or more lasers; silica-based fiber; and/or non-linear converters (e.g., optical parametric converter; optical parametric oscillator, OPO). Techniques disclosed herein may be used in numerous applications including, but not limited to, the described middle infrared (MIR) distributed architecture laser systems.

Some embodiments of the present invention may be implemented to realize reductions in weight, bulk, power consumption, and/or cost as compared to conventional devices/methodologies. Also, some embodiments may be used across a broad temperature range, such as the MIL-SPEC temperature range (e.g., exterior temperatures in the range of about −54-71° C. and/or interior temperatures in the range of about −55-125° C.), without requiring active cooling componentry, such as, but not limited to, thermoelectric coolers and/or cryo-coolers (e.g., solid state components of the system may be operated in an uncooled fashion and/or with cooling provided only by ambient/surrounding conditions). Furthermore, some embodiments of the present invention may be more reliable than conventional designs because there are fewer optics in the beam line and thus may realize an increase in the integrity of the output beam, given that overall beam loss decreases as the number of optical components disposed in the beam line decreases.

System Architecture and Operation

FIG. 1 illustrates a block diagram view of a laser system 100 configured in accordance with an embodiment of the present invention. As can be seen, system 100 includes, for example, an initial laser 110, a fiber coupling device 120, and a remote optical converter (ROC) 130. In some embodiments, ROC 130 includes, for example, a remote laser 140 and, optionally, a non-linear converter 150. As will be appreciated in light of this disclosure, system 100 may include additional, fewer, and/or different elements or components from those here described. The claimed invention is not intended to be limited to any particular system configurations, but can be used with numerous configurations in numerous applications.

As can be seen, initial laser 110 may be configured to provide a pump signal to ROC 130 (e.g., to remote laser 140) positioned remotely downstream. In accordance with an embodiment, several factors may be considered in implementing a given initial laser 110. For example, a first factor pertains to the wavelength (or range of wavelengths) of the pump signal to be generated/emitted by initial laser 110. In some cases, the suitability of the wavelength(s) of the pump signal may be dictated, at least in part, by the requirements and/or characteristics of the downstream remote laser 140. For example, and in accordance with an embodiment of the present invention, it may be desirable to provide an initial laser 110 configured to generate/emit a pump signal that allows for: (1) low-loss transport of the pump signal over a fiber coupling device 120; and/or (2) efficient absorption of the pump signal by remote laser 140. Thus, and in accordance with a specific example embodiment, initial laser 110 may be configured to generate/emit a low-peak-power (e.g., in the range of about 20-200 W), continuous wave (CW) pump signal having a wavelength of less than 2 µm (e.g., less than or equal to about 0.7-1.9 µm). Other suitable configurations of initial laser 110 and/or appropriate pump signal wavelength (s) generated/emitted thereby will depend on a given application and will be apparent in light of this disclosure.

A second factor pertains to the type of laser source implemented in initial laser 110. In some cases, the type of initial laser 110 may be dictated, at least in part, by the aforementioned considerations regarding the suitable wavelength(s) of the pump signal. A variety of laser sources may be implemented in initial laser 110 to generate/emit an appropriate pump signal (e.g., having a peak power in the range of about 20-200 W and/or having a wavelength of less than 2 µm). For instance, and in accordance with an example embodiment, initial laser 110 may be a thulium-doped fiber laser (Tm:FL) configured to provide a pump signal using a thulium fiber oscillator, which generates a low-peak-power, CW signal having a wavelength of less than 2 μm. Other suitable fiber lasers will depend on a given application and will be apparent in light of this disclosure. For example, a different fiber laser which emits a similar wavelength (or range of wavelengths) to that of Tm:FL may be used, in an alternative embodiment.

In other example embodiments, initial laser 110 may be a semiconductor diode laser configured to provide a suitable pump signal (e.g., in the visible spectrum range up to 2 μm). Example suitable semiconductor diode lasers include, but are not limited to: (1) gallium arsenide (GaAs); and (2) indium phosphide (InP). Other suitable semiconductor diode lasers will depend on a given application and will be apparent in light of this disclosure.

In still other example embodiments, initial laser 110 may be a thulium (Tm)-doped solid state laser configured to provide an appropriate pump signal (e.g., less than 2 μm). Example suitable Tm-doped solid state lasers include, but are not limited to: (1) Tm-doped yttrium lithium fluoride (Tm:YLF); (2) Tm-doped yttrium aluminum perovskite (Tm:YAP); and (3) Tm-doped yttrium aluminum garnet (Tm:YAG). Other suitable solid state lasers will depend on a given application and will be apparent in light of this disclosure.

Other factors which may be considered in determining the suitability of a given initial laser 110 may include, but are not limited to: (1) its ease of use/compatibility with existing silica glass fibers; (2) its capability of transmitting the pump signal over, for example, fiber coupling device 120 (e.g., a silica glass fiber medium); (3) its capability of sufficiently pumping/energizing remote laser 140 (e.g., to produce a higher-peak-power, pulsed signal) and an optionally included non-linear converter 150 (e.g., optical parametric oscillator, OPO) in a remote location; and/or (4) the specific characteristics/requirements of the downstream remote laser 140 of ROC 130. Other suitable configurations/types of initial laser 110 will depend on a given application and will be apparent in light of this disclosure.

As can further be seen in FIG. 1, system 100 may include a fiber coupling device 120 that operatively couples initial laser 110 with the downstream remote laser 140 of ROC 130. In some cases, fiber coupling device 120 may be configured to transport, for example, a pump signal (e.g., having a peak power in the range of about 20-200 W and/or having a wavelength of less than 2 μm) produced by initial laser 110 to ROC 130.

Figure 2:
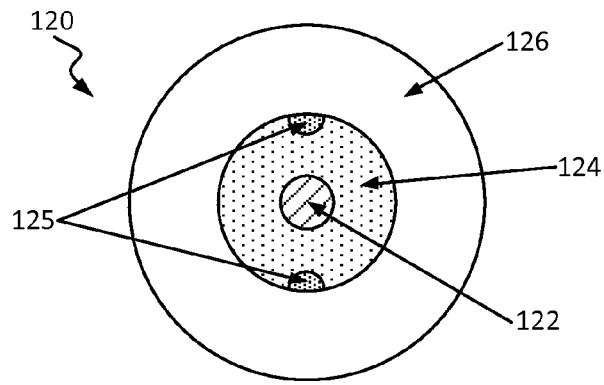
FIG. 2 illustrates a cross-section view of an example fiber coupling device configured in accordance with an embodiment of the present invention.

FIG. 2 illustrates a cross-section view of an example fiber coupling device 120 configured in accordance with an embodiment of the present invention. As can be seen, fiber coupling device 120 may implement a core 122. In accordance with an embodiment, example materials suitable for core 122 include, but are not limited to: (1) silica glass fiber; (2) phosphate glass fiber; and/or (3) germanate glass fiber. In one specific example embodiment, core 122 may have a diameter in the range of about 10-100 μm (e.g., less than or equal to about 50 μm).

In some cases, fiber coupling device 120 may implement a cladding 124. In one specific example embodiment, cladding 124 may be silica and/or have a diameter in the range of about 300-650 μm (e.g., less than or equal to about 480 μm).

In some cases, fiber coupling device 120 may implement a coating 126. In one specific example embodiment, coating 126 may be single layer acrylate and/or have a diameter in the range of about 400-800 μm (e.g., less than or equal to about 610 μm). In some instances, coating 126 may effectively act as an outer cladding layer which allows light (e.g., the pump signal) to propagate in cladding 124, in accordance with an embodiment.

In some cases, fiber coupling device 120 may comprise one or more optional stress rods 125 to assist, for example, with achieving linearly polarized output. In one specific example embodiment, stress rods 125 may be boron-doped stress applying parts (SAPs).

Other suitable materials and/or configurations for fiber coupling device 120 will depend on a given application and will be apparent in light of this disclosure. For example, while the specific example embodiment depicted in FIG. 2 shows a single optical fiber, the claimed invention is not so limited; for instance, fiber coupling device 120 alternatively may be configured as: (1) a point-to-point fiber; (3) a series of fibers; and/or (4) a fiber switch (e.g., which may allow implementation of multiple downstream ROCs, discussed in detail below with reference to FIG. 5A).

In some example cases in which initial laser 110 is a fiber laser (e.g., Tm-doped fiber laser), fiber coupling device 120 may be, for example, fusion spliced to an output end of the fiber laser and coupled to the input end of remote laser 140. However, the claimed invention is not so limited; for example, in an alternative embodiment, a suitable lens assembly may be provided on the output end of initial laser 110 and on the input end of remote laser 140, and a suitably configured fiber coupling device 120 may be operatively coupled there between. In some such cases, this may provide for efficient and/or repeatable removal/replacement of fiber coupling device 120. As will be appreciated, a given fiber coupling device 120 and/or lens assembly may be chosen, at least in part, based on the power level of the laser system. Other suitable configurations/materials for fiber coupling device 120 will depend on a given application and will be apparent in light of this disclosure.

Returning to FIG. 1, as can further be seen, a remote optical converter (ROC) 130 may be coupled with initial laser 110 at a remote location (e.g., separate/discrete from initial laser 110), and the pump signal generated by initial laser 110 may be transported via fiber coupling device 120 to ROC 130. In accordance with an embodiment of the present invention, ROC 130 may be configured to convert the CW pump signal generated/emitted by initial laser 110 (e.g., a CW pump signal having a peak power in the range of about 20-200 W and/or having a wavelength of less than 2 μm) into: (1) a higher-peak-power (e.g., in the range of about 3,000-30,000 W; about three to six orders of magnitude higher than normal power) output signal having one or more comparatively longer wavelengths (e.g., in the range of about 2-20 μm, or greater); or (2) a lower-peak-power (e.g., in the range of less than about 20-200 W) output signal having one or more comparatively shorter wavelengths (e.g., less than or equal to about 0.7-1.9 μm). Other possible power and/or wavelength ranges of output signals that may be provided by ROC 130 will depend on a given application and will be apparent in light of this disclosure.

Figure 3:
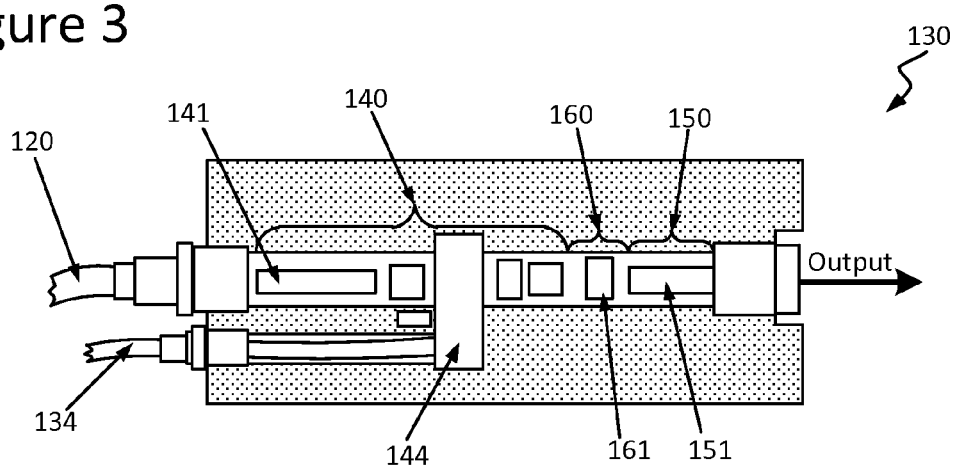
FIG. 3 illustrates a schematic view of an example remote optical converter (ROC) configured in accordance with an embodiment of the present invention.

FIG. 3 illustrates a schematic view of an example remote optical converter (ROC) 130 configured in accordance with an embodiment of the present invention. As previously noted, ROC 130 may implement a remote laser 140 configured as a CW and/or modulated laser signal source. In some cases, remote laser 140 may be configured to provide a high-peak-power, pulsed laser signal. Remote laser 140 may include a laser medium 141 such as, but not limited to: (1) neodymium (Nd); (2) ytterbium (Yb); (3) erbium (Er); (4) holmium (Ho); and (5) titanium sapphire (Ti:Al$_2$O$_3$). In some cases, laser medium 141 may be chosen, at least in part, based on the compatibility of its absorption properties with initial laser 110 to ensure sufficient pumping/energizing thereby. Thus, in accordance with some specific example embodiments, remote laser 140 may implement a laser medium 141 such as, but not limited to: Nd-doped, Yb-doped, Er-doped, Tm-doped, and Ho-doped host crystals. For instance, in one specific example embodiment, remote laser 140 may be a Ho-doped laser, such as, but not limited to: (1) a Ho-doped yttrium aluminum garnet (Ho:YAG) laser; (2) a Ho-doped yttrium lithium fluoride (Ho:YLF) laser; (3) a Ho-doped yttrium aluminum perovskite (Ho:YAP) laser; and/or (4) a Ho-doped yttrium vanadate (Ho:YVO$_4$) laser. In some embodiments implementing a Ho-based remote laser 140, for example, initial laser 110 correspondingly may be configured to generate/emit a pump signal having a wavelength, for instance, of less than or equal to about 1.9 μm. Other suitable laser media 141 and/or configurations for remote laser 140 will depend on a given application and will be apparent in light of this disclosure.

As previously noted, ROC 130 also optionally may implement a non-linear converter 150. In some such embodiments, the pump signal generated by initial laser 110 is converted by ROC 130 to longer/shorter wavelength(s) and is emitted, for instance, as generally represented by, but not limited to, the directional arrows depicted in FIG. 1: (1) idler $v_1$; (2) signal $v_2$; and (3) residual pump $v_3$. While FIG. 1 depicts one example embodiment in which non-linear converter 150 is positioned downstream or is otherwise discrete from remote laser 140, the invention is not so limited; for instance, and in accordance with an embodiment, a non-linear converter 150 may be included/positioned, for example, inside the optical cavity of remote laser 140. Other configurations/locations for a non-linear converter 150, when optionally included, will be apparent in light of this disclosure.

In some embodiments, non-linear converter 150 may be operatively coupled to remote laser 140 via connection 160. As will be appreciated, the type/nature of connection 160 will vary for a given application. For example, in some instances in which a linear OPO is implemented as optional non-linear converter 150, an isolator 161 (e.g., polarizer-rotator-optional polarizer) may be employed at connection 160. In some other instances in which a ring OPO is implemented as optional non-linear converter 150, an isolator 161 may not be necessary, and instead the signal may be directed through the air from remote laser 140 to the non-linear converter 150, provided that the distance there between is sufficiently short. In some other instances still, an optional wave plate (e.g., ¼turn, etc.) may be employed at connection 160. Other suitable configurations for connection 160 will depend on a given application and will be apparent in light of this disclosure.

As previously noted, in some embodiments, non-linear converter 150 may be implemented as an optical parametric oscillator (OPO) or other optical parametric converter, and thus may permit ROC 130 to generate/emit longer wavelength signals (e.g., as compared to the wavelength of the incident pump signal from initial laser 110). In other embodiments, non-linear converter 150 may be implemented as a harmonic generator, and thus may permit ROC 130 to generate/emit shorter wavelength signals (e.g., as compared to the wavelength of the incident pump signal from initial laser 110).

Figure 4:
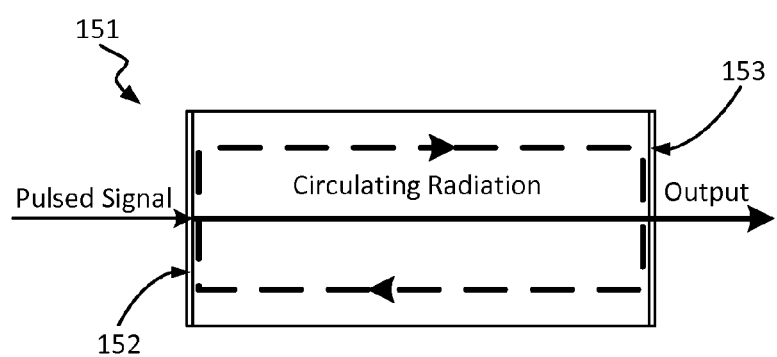
FIG. 4 illustrates a cross-section view of an example non-linear medium configured in accordance with an embodiment of the present invention.

FIG. 4 illustrates a cross-section view of an example non-linear medium 151 configured in accordance with an embodiment of the present invention. Non-linear converter 150 may implement a non-linear medium 151 (e.g., crystal) that can convert the incident laser energy generated/emitted by remote laser 140. For example, and in accordance with an embodiment, non-linear converter 150 may implement a given non-linear crystal 151 to generate emission signals having a wavelength up to 2 μm. As will be appreciated, non-linear converter ranges may be governed, at least in part, by the limits of their phase matching and/or transparency; thus, and in accordance with an embodiment, ROC 130 may include a non-linear converter 150 that functions, for example, over a broader range than the aforementioned example range of up to 2 μm (e.g., in the range of about 2-20 μm or greater).

Depending on the configuration of non-linear converter 150, when optionally implemented in ROC 130, the output signal may range, for example, from very short wavelengths in the ultraviolet (UV) region (e.g., if the non-linear converter 150 is implemented as a harmonic generator, which may convert the incident laser energy from remote laser 140 to a comparatively shorter wavelength) to very long wavelengths in the far infrared (FIR) region (e.g., if the non-linear converter 150 is implemented as an OPO, which may convert the incident laser energy from remote laser 140 to a comparatively longer wavelength), in accordance with some embodiments of the present invention. Thus, system 100 may be implemented to produce a very wide range of output signals without damaging the fiber transport medium (e.g., fiber coupling device 120).

As will be appreciated, non-linear converter 150 (e.g., an OPO) may be implemented with a non-linear medium 151 and appropriate input and output couplers (e.g., high-reflectivity and partial-reflectivity mirrors, respectively), in accordance with an embodiment. However, the claimed invention is not so limited. For instance, non-linear converter 150 may forego inclusion of such mirrors (e.g., to conserve space/minimize weight) and instead, as can be seen from FIG. 4, implement a non-linear medium 151 (e.g., a non-linear, monolithic crystal) that is configured to include one or more coatings 152/153 on its end faces. For example, and in accordance with an embodiment, the input end (e.g., end face which receives the pulsed signal generated/emitted by remote laser 140) may be configured with a high-reflectivity coating 152 (e.g., which functions similarly to the aforementioned high-reflectivity mirror) as its input coupler. Similarly, and in accordance with an embodiment, the output end (e.g., end face from which the output signal exits non-linear converter 150) may be configured with a partial-reflectivity coating 153 (e.g., which functions similarly to the aforementioned partial-reflectivity mirror) as its output coupler. Other suitable configurations for non-linear medium 151 and/or non-linear converter 150 will depend on a given application and will be apparent in light of this disclosure.

In some embodiments, the non-linear converter 150, when included, can be matched to a given laser source implemented in remote laser 140 (e.g., a given non-linear medium 151 can be chosen, at least in part, based on the laser medium 141 implemented) and thus used to generate optical output, for example, in the infrared (IR) range. One such alternative includes phase-matched and transparent, non-linear crystals, such as, but not limited to: (1) cadmium selenide (CdSe); (2) silver gallium sulfide (AgGaS$_2$); (3) silver gallium selenide (AgGaSe$_2$); (4) gallium(n) selenide (GaSe); (5) rubidium titanyl arsenate (RbTiOAsO$_4$ or RTA); (6) potassium titanyl arsenate (KTiOAsO$_4$ or KTA); (7) potassium titanyl phosphate (KTiOPO$_4$ or KTP); and/or (8) lithium niobate (LiNbO$_3$). Another alternative includes quasi-phase matched variants of the aforementioned transparent, non-linear crystals, such as, but not limited to: (1) periodically-poled lithium niobate LiNbO$_3$ (PPLN); (2) periodically-poled lithium tantalate LiTaO$_3$ (PPLT); and/or (3) periodically-poled potassium titanyl phosphate KTiOPO$_4$ (PPKTP). Still other alternatives include, but are not limited to: (1) zinc germanium phosphide (ZnGeP$_2$ or ZGP); (2) orientation-patterned gallium arsenide (OPGaAs); and/or (3) orientation-patterned gallium phosphide (OPGaP). Other suitable types of non-linear media 151 and/or non-linear converters 150 will be apparent in light of this disclosure.

Returning to FIG. 3, in some cases the efficiency of an optionally included non-linear converter 150 may be improved, for example, by configuring remote laser 140 to generate a high-peak-power, short-pulse signal by means of Q-switching in the optical cavity thereof. Thus, and in accordance with an embodiment, remote laser 140 may implement a Q-switch 144, which may be configured as, for example: (1) an acousto-optic Q-switch; (2) an electro-optic Q-switch; and/or (3) a passive Q-switch using a saturable absorbing medium. In some cases, Q-switch 144 may be operatively coupled, for example, with an RF attachment 134 configured to provide a suitable pulsing frequency for pulsing the output signal of remote laser 140. Other suitable configurations for Q-switch 144 will depend on a given application and will be apparent in light of this disclosure.

In some cases, ROC 130 (and more generally, system 100) may be configured to include additional optics configured to condition the signal generated/emitted by ROC 130 prior to its exit therefrom. For example, and in accordance with an embodiment, ROC 130 may include one or more lenses, mirrors, etc., configured to condition the output signal. In some such cases, the additional conditioning optics may be included within the non-linear converter 150 (when optionally implemented) and/or may be otherwise operatively coupled with ROC 130 (e.g., optional conditioning may be performed downstream of ROC 130). As will be appreciated in light of this disclosure, any number of suitable methods for conditioning laser signals may be implemented, and the claimed invention is not intended to be limited to any one of the aforementioned example configurations/techniques.

Figure 5A:
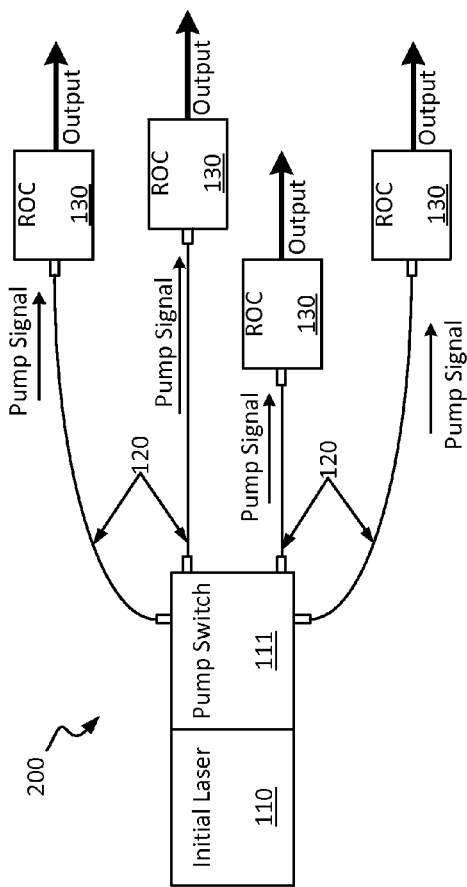
FIG. 5A illustrates a block diagram view of a laser system configured in accordance with an embodiment of the present invention.

As will be appreciated in light of this disclosure, the claimed invention is not limited to implementing only a single ROC 130 (e.g., including a remote laser 140 and/or optionally included non-linear converter 150). In some cases, there may be more than one remotely located laser 140 and/or non-linear converter 150. For example, FIG. 5A illustrates a block diagram view of a laser system 200 configured in accordance with an embodiment of the present invention. As can be seen, in some embodiments, system 200 may be configured with multiple ROCs 130 operatively coupled in parallel to initial laser 110. In some such cases, a pump switch 111 may be operatively coupled with initial laser 110 and configured to provide the pump signal from initial laser 110 to one or more downstream ROCs 130, as desired. As will further be appreciated, the claimed invention is not limited to a system 200 implementing only a single initial laser 110 so configured, but rather may implement multiple initial lasers 110 with multiple ROCs 130 arranged in parallel, in accordance with an embodiment.

Figure 5B:
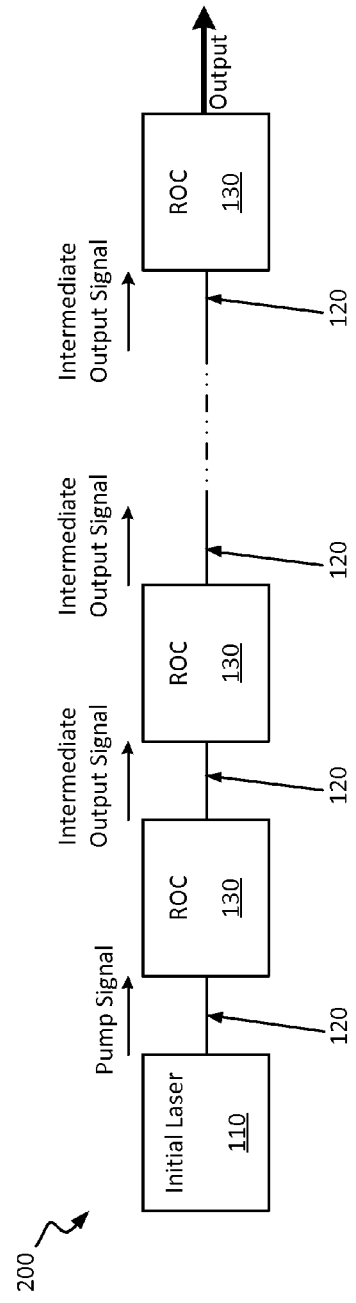
FIG. 5B illustrates a block diagram view of a laser system configured in accordance with an embodiment of the present invention.

FIG. 5B illustrates a block diagram view of a laser system 200 configured in accordance with an embodiment of the present invention. As can be seen, in some embodiments, system 200 alternatively may be configured with multiple ROCs 130 operatively coupled with one another in series, each ROC 130 in turn generating additional wavelengths (e.g., intermediate output signal) up to the desired output range. In some such embodiments, each upstream ROC 130 may be operatively coupled to a downstream ROC 130 by an optical fiber (e.g., fiber coupling device 120) and/or other suitable connection. Other suitable configurations/arrangements for systems 200 implementing multiple initial lasers 110 and/or ROCs 130 will depend on a given application and will be apparent in light of this disclosure.

As used herein, the term "signal" means a light beam.

As used herein, the term "remote" refers to a system component, such as an optical converter (e.g., remote optical converter, ROC), which does not receive input directly from a source (e.g., laser source), but rather receives input from a source by way of a fiber coupling device interposed there between.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A device comprising:
a first laser configured to emit a first signal, the first signal comprising a continuous wave signal having a wavelength less than about 2 μm and a peak power which does not induce a non-linear response;
a remote optical converter configured to convert the first signal to a second signal of at least one of a different peak power and a different wavelength than the first signal, the remote optical converter comprising:
a second laser; and
a non-linear converter operatively coupled with the second laser; and
an optical fiber operatively coupling the first laser and the remote optical converter, wherein the optical fiber is configured to transport the first signal from the first laser to the second laser.

2. The device of claim 1, wherein the peak power level of the first signal does not cause damage in the optical fiber.

3. The device of claim 1, wherein:
the peak power of the first signal is less than about 200 W;
the non-linear converter comprises an optical parametric oscillator; and
the second signal is of higher peak power than the first signal and has a wavelength in the range of 2-5 μm or greater.

4. The device of claim 1, wherein:
the peak power of the first signal is less than about 200 W;
the non-linear converter comprises a harmonic generator; and
the second signal is of lower peak power than the first signal and has a wavelength in the range of about 0.7-1.9 μm.

5. The device of claim 1, wherein the non-linear converter comprises cadmium selenide, silver gallium sulfide, silver gallium selenide, gallium(II) selenide, rubidium titanyl arsenate, potassium titanyl arsenate, potassium titanyl phosphate, lithium niobate, periodically-poled lithium niobate, periodically-poled lithium tantalate, or periodically-poled potassium titanyl phosphate, orientation-patterned gallium arsenide, orientation-patterned gallium phosphide, or zinc germanium phosphide.

6. The device of claim 1, wherein the first laser comprises thulium (Tm)-doped fiber, gallium arsenide (GaAs), indium phosphide (InP), Tm-doped yttrium lithium fluoride (Tm:YLF), Tm-doped yttrium aluminum perovskite (Tm:YAP), or Tm-doped yttrium aluminum garnet (Tm:YAG).

7. The device of claim 1, wherein the second laser is Q-switched via an operatively coupled acousto-optic Q-switch, electro-optic Q-switch, or passive Q-switch using a saturable absorbing medium.

8. The device of claim 1, wherein the second laser comprises a neodymium-, holmium-, erbium-, thulium-, or ytterbium-doped crystal.

9. The device of claim 1, wherein the second laser comprises holmium (Ho)-doped yttrium aluminum garnet (Ho:YAG), Ho-doped yttrium lithium fluoride (Ho:YLF), Ho-doped yttrium aluminum perovskite (Ho:YAP), or Ho-doped yttrium vanadate (Ho:YVO$_4$).

10. The device of claim 1, wherein the optical fiber comprises silica glass fiber, phosphate glass fiber, or germanate glass fiber.

11. The device of claim 1, wherein the first laser comprises a fiber laser and the optical fiber is fusion spliced to an output thereof.

12. The device of claim 1, wherein the optical fiber further comprises a lens assembly for operatively coupling the first laser and the remote optical converter.

13. The device of claim 1, wherein the device is configured to operate in the temperature range of about −55-125° C. in the absence of active cooling.

14. A method comprising:
    producing a first signal with a first laser, the first signal comprising a continuous wave signal having a wavelength less than about 2 μm and a peak power which does not induce a non-linear response;
    transporting the first signal over an optical fiber operatively coupling the first laser to a remote optical converter comprising:
        a second laser; and
        a non-linear converter operatively coupled with the second laser; and
    converting the first signal with the remote optical converter into a second signal, wherein the second signal has at least one of a different peak power and a different wavelength than the first signal.

15. The method of claim 14 further comprising conditioning the second signal.

16. The method of claim 14, wherein the first laser comprises thulium (Tm)-doped fiber, gallium arsenide (GaAs), indium phosphide (InP), Tm-doped yttrium lithium fluoride (Tm:YLF), Tm-doped yttrium aluminum perovskite (Tm:YAP), or Tm-doped yttrium aluminum garnet (Tm:YAG).

17. The method of claim 14, wherein the non-linear converter comprises an optical parametric oscillator or a harmonic generator.

18. The method of claim 14, wherein the optical fiber comprises silica glass fiber, phosphate glass fiber, or germanate glass fiber.

* * * * *